(12) United States Patent
Ryu et al.

(10) Patent No.: US 11,723,186 B2
(45) Date of Patent: Aug. 8, 2023

(54) MEMORY CELL AND MEMORY DEVICE WITH THE SAME

(71) Applicant: SK hynix Inc., Gyeonggi-do (KR)

(72) Inventors: Seung Wook Ryu, Gyeonggi-do (KR); Kyoung Ryul Yoon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 200 days.

(21) Appl. No.: 17/193,327

(22) Filed: Mar. 5, 2021

(65) Prior Publication Data

US 2022/0122975 A1 Apr. 21, 2022

(30) Foreign Application Priority Data

Oct. 16, 2020 (KR) .................. 10-2020-0134018

(51) Int. Cl.
| | | |
|---|---|---|
| *H01L 27/108* | (2006.01) | |
| *H10B 12/00* | (2023.01) | |
| *H01L 29/786* | (2006.01) | |
| *H01L 29/06* | (2006.01) | |
| *H01L 49/02* | (2006.01) | |
| *H01L 29/423* | (2006.01) | |

(52) U.S. Cl.
CPC .............. *H10B 12/30* (2023.02); *H01L 28/40* (2013.01); *H01L 29/0673* (2013.01); *H01L 29/7869* (2013.01); *H01L 29/78618* (2013.01); *H01L 29/78696* (2013.01); *H10B 12/03* (2023.02); *H10B 12/05* (2023.02); *H10B 12/50* (2023.02); *H01L 28/86* (2013.01); *H01L 29/42392* (2013.01); *H10B 12/482* (2023.02); *H10B 12/488* (2023.02)

(58) Field of Classification Search
CPC ......... H01L 27/10805; H01L 27/10847; H01L 27/1085; H01L 27/10873; H01L 27/10882; H01L 27/10885; H01L 27/10891; H01L 27/10897; H01L 28/40; H01L 28/60; H01L 28/86; H01L 29/0673; H01L 29/42392; H01L 29/78618; H01L 29/78642; H01L 29/7869; H01L 29/78696; H01L 29/7926; B82Y 10/00; B82Y 40/00; H10B 12/03; H10B 12/05; H10B 12/30; H10B 12/482; H10B 12/488; H10B 12/50
See application file for complete search history.

(56) References Cited

U.S. PATENT DOCUMENTS 10,535,659 B2  1/2020  Kim et al.
2019/0103407 A1*  4/2019  Kim .................... H01L 27/1085

* cited by examiner

*Primary Examiner* — Cheung Lee
(74) *Attorney, Agent, or Firm* — IP & T Group LLP (57) ABSTRACT

A memory device including a substrate; a bit line laterally oriented to be parallel to the substrate; a transistor including two channels that are laterally oriented from the bit line and a word line that is vertically oriented and surrounds the two channels; and a capacitor laterally oriented from the transistor.

24 Claims, 5 Drawing Sheets

MEMORY CELL AND MEMORY DEVICE WITH THE SAME

CROSS-REFERENCE TO RELATED APPLICATIONS

The present application claims priority to Korean Patent Application No. 10-2020-0134018, filed on Oct. 16, 2020, which is incorporated herein by reference in its entirety.

BACKGROUND

1. Field

Various embodiments of the present invention relate to a semiconductor device, and more particularly, to a memory cell with improved degree of integration, and a semiconductor device including the same.

2. Description of the Related Art

Since the integration of two-dimensional (2D) semiconductor devices mainly depends on the area occupied by memory cells, the integration is greatly affected by the fine pattern formation. Since ultra-high-price equipment is required to form fine patterns, the integration of the 2D semiconductor devices although increasing, has practical limitations. To address this concern, a memory device having three-dimensionally arranged memory cells has been proposed.

SUMMARY

Embodiments of the present invention are directed to a memory cell with an improved degree of integration, and a memory device including the memory cells.

In accordance with an embodiment of the present invention, a memory device includes: a substrate; a bit line laterally oriented to be parallel to the substrate; a transistor including two channels that are laterally oriented from the bit line and a word line that is vertically oriented and surrounds the two channels; and a capacitor laterally oriented from the transistor.

In accordance with another embodiment of the present invention, a memory device includes: a substrate including a peripheral circuit portion; and a memory cell array including a plurality of memory cells that are vertically stacked from the peripheral circuit portion, wherein each of the memory cells includes: a bit line that is laterally oriented to be parallel to the substrate; a transistor including two nano sheet channels that are laterally oriented from the hit line, and a word line that is vertically oriented and surrounds the two nano sheet channels; and a capacitor that is laterally oriented from the transistor.

BRIEF DESCRIPTION OF THE DRAWINGS

FIGS. 3A to 6 illustrate schematic structures of memory devices in accordance with other embodiments of the present invention.

DETAILED DESCRIPTION

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but &so a case where a third layer exists between the first layer and the second layer or the substrate.

Figure 1:
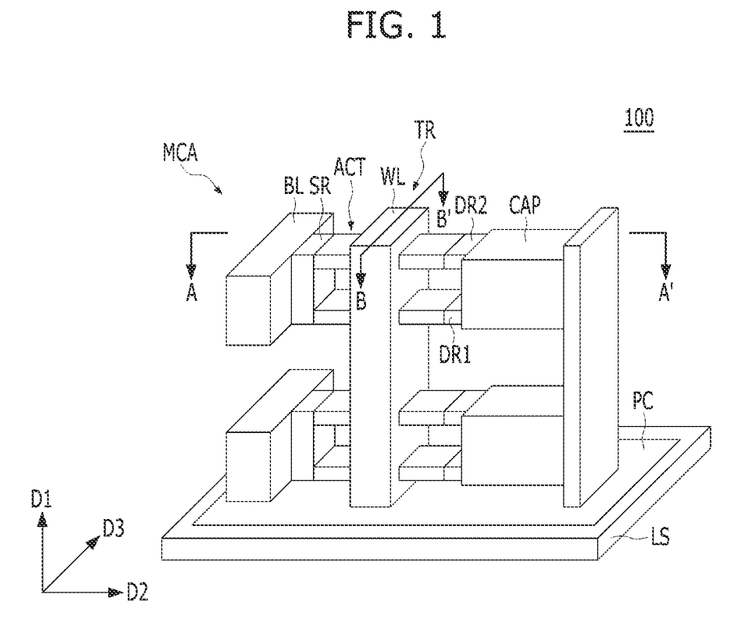
FIG. 1 is a perspective view illustrating a schematic structure of a memory device in accordance with an embodiment of the present invention.
Figure 2A:
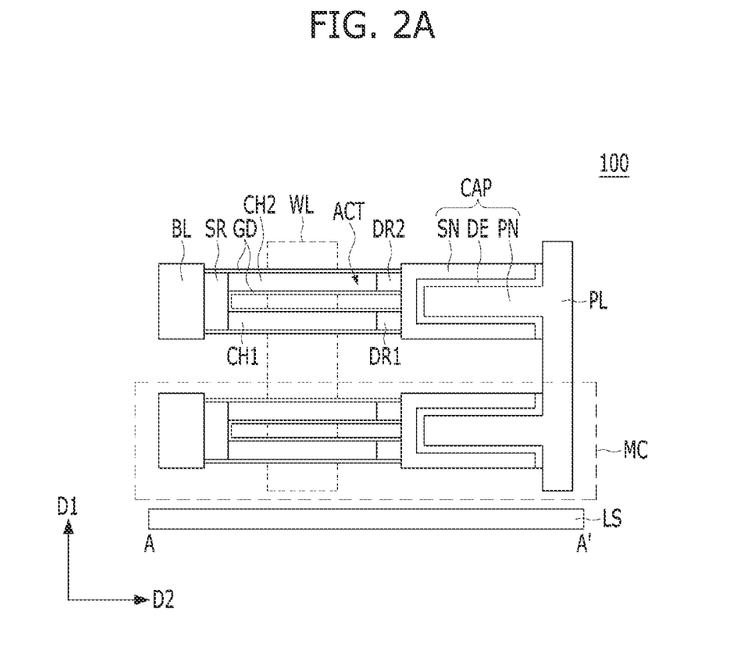
FIG. 2A is a cross-sectional view taken along a line A-A' shown in FIG. 1.
Figure 2B:
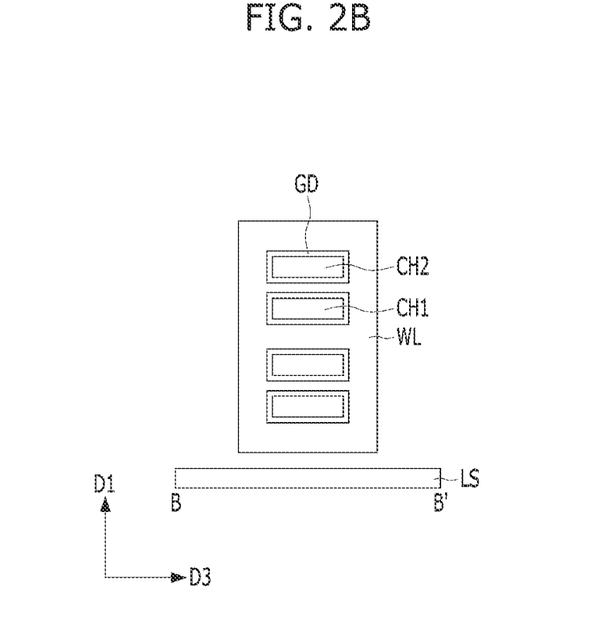
FIG. 2B is a cross-sectional view taken along a line B-B' shown in FIG. 1.

FIG. 1 is a perspective view illustrating a schematic structure of a memory device 100 in accordance with an embodiment of the present invention. FIG. 2A is a cross-sectional view taken along a line A-A' shown in FIG. 1. FIG. 2B is a cross-sectional view taken along a line B-B' shown in FIG. 1.

Referring to FIGS. 1 to 2B, the memory device 100 may include a plurality of memory cells MC. The memory cells MC may he positioned over a substrate structure LS. According to an embodiment of the present invention, the memory device 100 may include a memory cell array MCA in which two memory cells MC are vertically stacked. Each memory cell MC may include a bit line BL, a transistor TR, and a capacitor CAP. The transistor TR may include a word line WL that is vertically oriented in a first direction D1. The bit line BL may be parallel to the substrate structure. The bit line BL may be laterally oriented in a third direction D3. The transistor TR may be laterally oriented in a second direction D2. The capacitor CAP may be laterally oriented in the second direction D2 from the transistor TR.

The substrate structure LS may be any material appropriate for semiconductor processing. The substrate structure LS may include at least one of a conductive material, a dielectric material, and a semiconductor material. Various materials may be formed in the substrate structure LS. The substrate structure LS may include a semiconductor substrate, and the semiconductor substrate may be formed of a silicon-containing material. For example, the substrate structure LS may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The substrate structure LS may include another semiconductor material, such as germanium. The substrate structure LS may include a III/V-group semiconductor substrate, for example, a compound semiconductor substrate, such as GaAs. The substrate structure LS may include a Silicon-On-Insulator (SOI) substrate.

According to another embodiment of the present invention, the substrate structure LS may include a semiconductor substrate, a plurality of integrated circuits formed over the semiconductor substrate, and a multi-level metal line MLM or a combination thereof, For example, the substrate structure LS may include a peripheral circuit portion PC, and the peripheral circuit portion PC may include a plurality of control circuits for controlling memory cells MC. The peripheral circuit portion PC may include a sense amplifier coupled to the bit line BL and a sub-word line driver coupled to the word line WL.

According to an embodiment of the present invention, the memory cell array MCA may be positioned at a higher level than the peripheral circuit portion PC. The bit line BL and the word line WL may be coupled to the peripheral circuit portion PC by using the multi-level metal line MLM (not shown). The memory cell array MCA may include memory cells MC that are vertically stacked over the peripheral circuit portion PC. The bit lines BL of the memory cell array MCA may extend laterally in the third direction D3 over the peripheral circuit portion PC.

According to another embodiment of the present invention, the memory cell array MCA may be positioned at a lower level than the peripheral circuit portion PC. In this case, the memory cell array MCA may include memory cells MC that are vertically stacked under the peripheral circuit portion PC. The bit lines BL of the memory cell array MCA may extend laterally in the third direction D3 under the peripheral circuit portion PC.

The bit line BL may include a laterally oriented pillar. The bit line BL may include a silicon-based material, a metal-based material, or a combination thereof. The bit line BL may include polysilicon, titanium nitride, tungsten, or a combination thereof. For example, the bit line BL may include polysilicon or titanium nitride (TiN) that is doped with an N-type impurity. The bit line BL may include a stack (TiN/W) of titanium nitride and tungsten. The bit line BL may include a laterally oriented metallic pillar.

The transistor TR may include a lateral transistor. The transistor TR may include a gate all-around (GAA) transistor. The transistor TR may include an active layer ACT and a word line WL. The active layer ACT may be laterally oriented in the second direction D2 from the bit line BL. The word line WL may be vertically oriented in the first direction D1. The active layer ACT may include a first doped portion SR, second doped portions DR1 and DR2, and channel portions CH1 and CH2. The channel portions CH1 and CH2 may be positioned between the first doped portion SR and the second doped portions DR1 and DR2. The first doped portion SR may provide a first edge of the active layer ACT, and the second doped portions DR1 and DR2 may provide a second edge of the active layer ACT. The active layer ACT may include a silicon-containing material. The active layer ACT may include a semiconductor material, a monocrystalline semiconductor material, a polycrystalline semiconductor material, an oxide semiconductor, a metal compound, or a combination thereof. For example, the active layer ACT may include monocrystalline silicon, polysilicon, silicon germanium, indium gallium zinc oxide (IGZO), $MoS_2$, or $WS_2$. The first doped portion SR and the second doped portions DR1 and DR2 may include an N-type impurity or a P-type impurity. The first doped portion SR and the second doped portions DR1 and DR2 may include phosphorus (P), arsenic (As), boron (B), indium (In), or a combination thereof. The first doped portion SR and the second doped portions DR1 and DR2 may be doped with the same impurity. The first doped portion SR and the second doped portions DR1 and DR2 may be referred to as a first sources/drain and a second sources/drain, respectively. The channel portions CH1 and CH2 may include an impurity that is different from those of the first and second doped portions SR, DR1, and DR2. The first doped portion SR, the channel portions CH1 and CH2, and the second doped portions DR1 and DR2 may be an integrated type, and thus the active layer ACT may have a "⊂" shape. The first doped portion SR may have an integrated source/drain structure that is commonly coupled to the first edges of the two channel portions CH1 and CH2, and the second doped portions DR1 and DR2 may have a separated source/drain structure. The second doped portions DR1 and DR2 are respectively coupled to the second edges of the two channel portions CH1 and CH2.

The channel portions CH1 and CH2 may be laterally oriented in the second direction D2. The channel portions CH1 and CH2 may be laterally oriented in the second direction D2 between the first doped portion SR and the second doped portions DR1 and DR2. The channel portions CH1 and CH2 may have a laterally flat plate shape. The channel portions CH1 and CH2 may have a greater length in the second direction D2 than a length in the third direction D3. The channel portions CH1 and CH2 may be referred to as nano sheets or nano sheet channels. Since the channel portions CH1 and CH2 are laterally oriented in the second direction D2, the channel portions CH1 and CH2 may be referred to as "lateral nano sheets". The channel portions CH1 and CH2 may include at least two channel portions, for example, a first channel portion CH1 and a second channel portion CH2. The first channel portion CH1 and the second channel portion CH2 may be vertically arranged in the first direction D1. A portion of the word line WL may fill the space between the first channel portion CH1 and the second channel portion CH2. The thickness of the first channel portion CH1 and the thickness of the second channel portion CH2 may be the same. Here, the thickness may be the thickness in the first direction D1. The channel portions CH1 and CH2 may include a semiconductor material, a monocrystailine semiconductor material, a polycrystalline semiconductor material, an oxide semiconductor, a metal compound, or a combination thereof. For example, the channel portions CH1 and CH2 may include monocrystalline silicon, polysilicon, silicon germanium, indium gallium zinc oxide (IGZO), $MoS_2$, or $WS_2$. The active layer ACT including the channel portions CH1 and CH2 may be formed by Atomic Layer Deposition (ALD).

The first doped portion SR may be coupled to the bit line BL. The first doped portion SR may be commonly coupled to the first edge of the channel portions CH1 and CH2. The first doped portion SR may be vertically oriented in the first direction D1.

The second doped portions DR1 and DR2 may be coupled to the capacitor CAP. The second doped portions DR1 and DR2 may be coupled to the storage node SN of the capacitor CAP. The second doped portions DR1 and DR2 may include a lower-level second doped portion DR1 and an upper-level second doped portion DR2. The lower-level second doped portion DR1 and the upper-level second doped portion DR2 may be vertically spaced apart from each other. The lower-level second doped portion DR1 may be coupled to the second edge of the first channel portion CH1, and the upper-level second doped portion DR2 may be coupled to the second edge of the second channel portion CH2.

The word line WL may be vertically oriented in the first direction D1 and may have a surrounding shape that surrounds the channel portions CH1 and CH2. The word line WL having the surrounding shape may be referred to as a gate all-around (GAA) word line.

The word line WL may include a silicon-containing material, a metal-containing material, or a combination thereof. The word line WL may include polysilicon, a metal, a metal silicide, a metal nitride, or a combination thereof. For example, the word line WL may include a stack of titanium nitride and tungsten.

A gate dielectric layer GD may be formed between the word line WL and the channel portions CH1 and CH2. The gate dielectric layer GD may surround the channel portions CH1 and CH2. The word line WL may surround the channel portions CH1 and CH2 with the gate dielectric layer GD interposed therebetween. The gate dielectric layer GD may have a surrounding shape that conformally surrounds the channel portions CH1 and CH2. The gate dielectric layer GD may include silicon oxide, silicon nitride, silicon oxynitride, a high-k material, or a combination thereof.

The capacitor CAP may be laterally disposed from the transistor TR. The capacitor CAP may be laterally oriented in the second direction D2. The capacitor CAP may include a storage node SN, a dielectric layer DE, and a plate node PN. The storage node SN, the dielectric layer DE, and the plate node PN may be laterally arranged in the second direction D2. In an embodiment, the storage node SN may have a laterally oriented cylindrical shape. In an embodiment, the plate node PN may have a shape surrounding the cylindrical shape of the storage node SN. The dielectric layer DE may have a shape covering the cylindrical surface of the storage node SN. The plate node PN may be coupled to the plate line PL. According to another embodiment of the present invention, the plate node PN and the plate line PL are integrated, and the plate node PN may be a portion of the plate line PL.

The storage node SN may have a three-dimensional structure, and the storage node SN having a three-dimensional structure may have a lateral three-dimensional structure that is parallel to the second direction D2. As an example of a three-dimensional structure, the storage node SN may have a cylinder shape, a pillar shape, or a pylinder shape in which a pillar shape and a cylinder shape are merged. In an embodiment, the storage node SN may have a cylindrical shape. The dielectric layer DE may be formed between the storage node SN and the plate node PN. The dielectric layer DE may directly contact the plate node PN. The storage node SN may be commonly coupled to the second doped portions DR1 and DR2.

The capacitor CAP may include a Metal-insulator-Metal (MIM) capacitor. The storage node SN and the plate node PN may include a metal-based material. The dielectric layer DE may include silicon oxide, silicon nitride, a high-k material, or a combination thereof. The high-k material may have a higher dielectric constant than silicon oxide, Silicon oxide ($SiO_2$) may have a dielectric constant of approximately 3.9, and the dielectric layer DE may include a high-k material having a dielectric constant of approximately 4 or more. The high-k material may have a dielectric constant of approximately 20 or more. The high-k material may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$) or strontium titanium oxide ($SrTiO_3$). According to another embodiment of the present invention, the dielectric layer DE may be formed of a composite layer including two or more layers of the high-k materials mentioned above.

The dielectric layer DE may be formed of zirconium-based oxide, The dielectric layer DE may have a stack structure including zirconium oxide ($ZrO_2$). The stack structure including zirconium oxide ($ZrO_2$) may include a ZA ($ZrO_2/Al_2O_3$) stack or a ZAZ ($ZrO_2/Al_2O_3/ZrO_2$) stack. The ZA stack may have a structure in which aluminum oxide ($Al_2O_3$) is stacked over zirconium oxide ($ZrO_2$). The ZAZ stack may have a structure in which zirconium oxide ($ZrO_2$), aluminum oxide ($Al_2O_3$), and zirconium oxide ($ZrO_2$) are sequentially stacked. The ZA stack and the ZAZ stack may be referred to as zirconium oxide-based layer ($ZrO_2$-based layer). According to another embodiment of the present invention, the dielectric layer DE may be formed of hafnium-based oxide. The dielectric layer DE may have a stack structure including hafnium oxide ($HfO_2$). The stack structure including hafnium oxide ($HfO_2$) may include an HA ($HfO_2/Al_2O_3$) stack or an HAH ($HfO_2/Al_2O_3/HfO_2$) stack. The HA stack may have a structure in which aluminum oxide ($Al_2O_3$) is stacked over hafnium oxide ($HfO_2$). The HAH stack may have a structure in which hafnium oxide ($HfO_2$), aluminum oxide ($Al_2O_3$), and hafnium oxide ($HfO_2$) are sequentially stacked. The HA stack and the HAH stack may be referred to as hafnium oxide-based layer ($HfO_2$-based layer). In the ZA stack, ZAZ stack, HA stack, and HAH stack, aluminum oxide ($Al_2O_3$) may have a larger band gap than zirconium oxide ($ZrO_2$) and hafnium oxide ($HfO_2$). Aluminum oxide ($Al_2O_3$) may have a lower dielectric constant than zirconium oxide ($ZrO_2$) and hafnium oxide ($HfO_2$). Accordingly, the dielectric layer DE may include a stack of a high-k material and a high band gap material having a larger band gap than the high-k material. The dielectric layer DE may include silicon oxide ($SiO_2$) as a high band gap material other than aluminum oxide ($Al_2O_3$). Since the dielectric layer DE contains a high band gap material, leakage current may be suppressed. The high band gap material may be extremely thin. A thickness of the high band gap material is in a range of 1 Å to 10 Å. The high band gap material may be thinner than the high-k material. According to another embodiment of the present invention, the dielectric layer DE may include a laminated structure in which a high-k material and a high band gap material are alternately stacked. For example, ZAZA ($ZrO_2/Al_2O_3/ZrO_2/Al_2O_3$), ZAZAZ ($ZrO_2/Al_2O_3/ZrO_2/Al_2O_3/ZrO_2$), HAHA ($HfO_2/Al_2O_3/HfO_2/Al_2O_3$) or HAHAH ($HfO_2/Al_2O_3/HfO_2/Al_2O_3/HfO_2$). In the laminated structure above, aluminum oxide ($Al_2O_3$) may be extremely thin. A thickness of the aluminum oxide is in a range of 1 Å to 10 Å.

According to another embodiment of the present invention, the dielectric layer DE may include a stack structure including zirconium oxide, hafnium oxide and aluminum oxide, a laminated structure thereof, or a mixture structure thereof.

According to another embodiment of the present invention, an interface control layer for improving leakage current may be further formed between the storage node SN and the dielectric layer DE. The interface control layer may include titanium oxide ($TiO_2$). The interface control layer may also be formed between the plate node PN and the dielectric layer DE.

The storage node SN and the plate node PN may include a metal, a noble metal, a metal nitride, a conductive metal oxide, a conductive noble metal oxide, a metal carbide, a metal silicide, or a combination thereof. For example, the storage node SN and the plate node PN may include titanium (Ti), titanium nitride (TiN), tantalum (Ta), tantalum nitride (TaN), tungsten (W), tungsten nitride (WN), ruthenium (Ru), ruthenium oxide ($RuO_2$), iridium oxide ($IrO_2$), platinum (Pt), molybdenum (Mo), molybdenum oxide (MoO), a titanium nitride/tungsten (TiN/W) stack, and a tungsten nitride/tungsten (WN/W) stack. The plate node PN may include a combination of a metal-based material and a silicon-based material, For example, the plate node PN may be a stack of titanium nitride/silicon germanium/tungsten nitride (TiN/SiGe/WN). In the titanium nitride/silicon germanium/tungsten nitride (TiN/SiGe/WN) stack, silicon germanium may be a gap-fill material filling the cylindrical inside of the storage node SN, and the titanium nitride is (TiN) may serve as a substantial plate node PN, and tungsten nitride may be a low-resistance material.

The plate line PL may be laterally oriented in the third direction D3 while being vertically oriented in the first direction D1 at the same time. The plate line PL may have a vertical flat plate shape. The plate node PN and the plate line PL may include the same material.

In the memory device 100, the memory cells MC may form a memory cell array MCA. The memory cell array MCA may include a stack of memory cells MC. The memory cells MC may be vertically stacked over the substrate structure LS in the first direction D1, and the memory cell array MCA may include memory cells MC that are arranged laterally in the second direction D2 and the third direction D3.

Figure 3A:
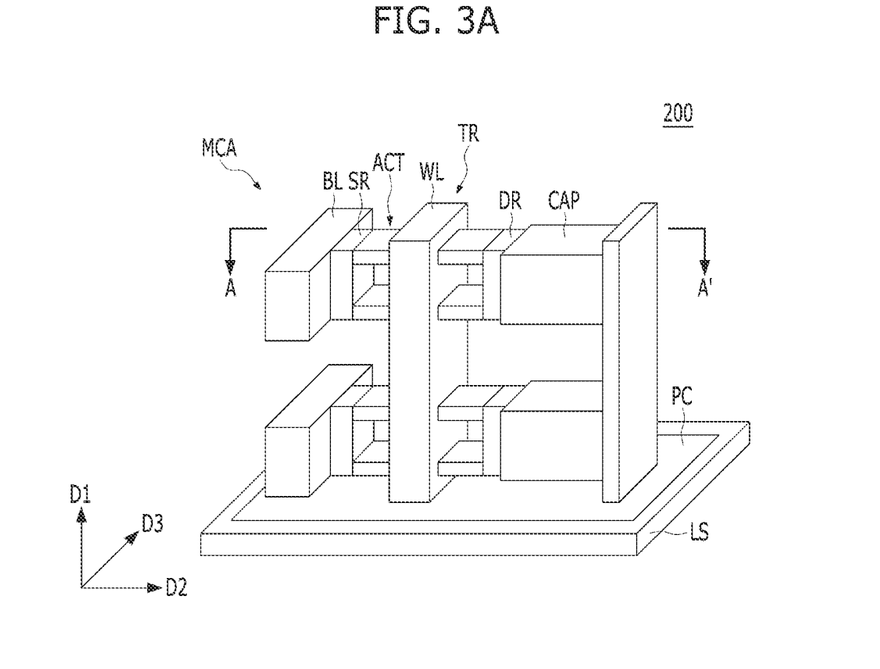
Figure 3B:
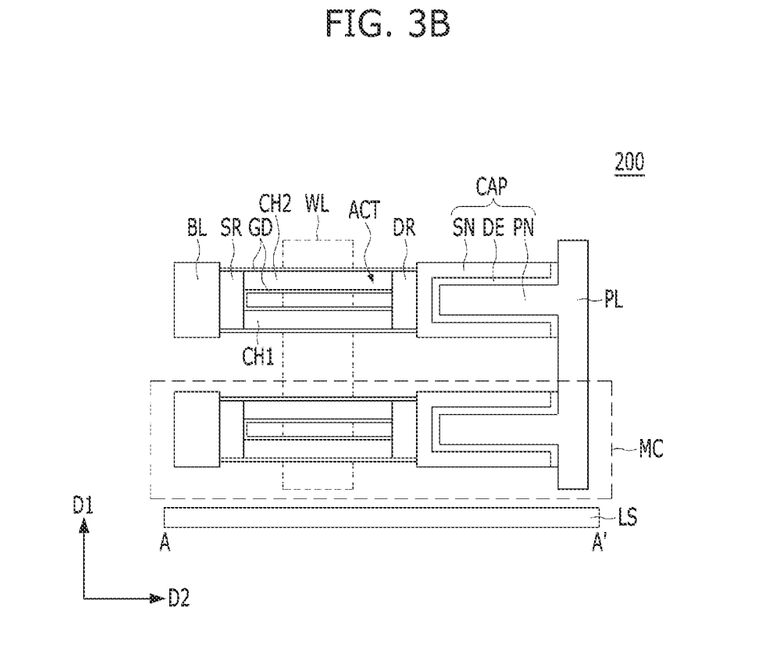

FIGS. 3A and 3B illustrate a schematic structure of a memory device 200 in accordance with another embodiment of the present invention. FIG. 3B is a cross-section& view taken along a line A-A' shown in FIG. 3A. In FIGS. 3A and 3B, the same reference numerals as those in FIGS. 1 to 2B denote the same constituent elements. Hereinafter, detailed descriptions for the same constituent elements will be omitted.

Referring to FIGS. 3A and 3B, the memory device 200 may include a plurality of memory cells MC. The plurality of memory cells MC may be positioned over the substrate structure LS. Each memory cell MC may include a bit line BL, a transistor TR, and a capacitor CAP. The transistor TR may include a word line WL that is vertically oriented in the first direction D1. The bit line BL may be laterally oriented in the third direction D3. The transistor TR may be laterally oriented in the second direction D2. The capacitor CAP may be laterally oriented in the second direction D2 from the transistor TR. The substrate structure LS may include a peripheral circuit portion PC, and the peripheral circuit portion PC may include a plurality of control circuits for controlling the memory cells MC. The peripheral circuit portion PC may include a sense amplifier that is coupled to the bit line BL and a sub-word line driver that is coupled to the word line WL.

The transistor TR may include a gate ail-around (GAA) transistor. The transistor TR may include an active layer ACT and a word line WL. The active layer ACT may be laterally oriented in the second direction D2 from the bit line BL. The word line WL may be vertically oriented in the first direction D1. The active layer ACT may include a first doped portion SR, a second doped portion DR, and channel portions CH1 and CH2. The channel portions CH1 and CH2 may be positioned between the first doped portion SR and the second doped portion DR. The first doped portion SR may provide a first edge of the active layer ACT, and the second doped portion DR may provide a second edge of the active layer ACT.

The channel portions CH1 and CH2 may be laterally oriented in the second direction D2. The channel portions CH1 and CH2 may be laterally oriented in the second direction D2 between the first doped portion SR and the second doped portion DR. The channel portions CH1 and CH2 may have a laterally flat plate shape. The channel portions CH1 and CH2 may have a greater length in the second direction D2 than a length in the third direction D3. The channel portions CH1 and CH2 may be referred to as nano sheets or nano sheet channels. Since the channel portions CH1 and CH2 are laterally oriented in the second direction D2, the channel portions CH1 and CH2 may be referred to as "lateral nano sheets". The channel portions CH1 and CH2 may be, for example, two channel portions including a first channel portion CH1 and a second channel portion CH2. The first channel portion CH1 and the second channel portion CH2 may be vertically arranged in the first direction D1. A portion of the word line WL may fill the space between the first channel portion CH1 and the second channel portion CH2. The thickness of the first channel portion CH1 and the thickness of the second channel portion CH2 may be the same. Here, the thickness may be the thickness in the first direction D1. The channel portions CH1 and CH2 may include a semiconductor material, a monocrystalline semiconductor material, a polycrystalline semiconductor material, an oxide semiconductor, a metal compound, or a combination thereof. For example, the channel portions CH1 and CH2 may include monocrystalline silicon, polysilicon, silicon germanium, indium gallium zinc oxide (IGZO), $MoS_2$, and $WS_2$.

The first doped portion SR may be coupled to the bit line BL. The first doped portion SR may be commonly coupled to first edges of the channel portions CH1 and CH2. The first doped portion SR may be vertically oriented in the first direction D1. The second doped portion DR may be coupled to the capacitor CAP. The second doped portion DR may be coupled to the storage node SN of the capacitor CAP. The second doped portion DR may be commonly coupled to second edges of the channel portions CH1 and CH2. The second doped portion DR may be vertically oriented in the first direction D1. The first doped portion SR, the channel portions CH1 and CH2, and the second doped portion DR may be formed to be integrated, and accordingly, the active layer ACT may have a ring shape having an inner gap. The first doped portion SR may have an integrated source/drain structure that is commonly coupled to the first edges of the two channel portions CH1 and CH2, and the second doped portions DR1 and DR2 may have an integrated source/drain structure that is commonly coupled to the second edges of the two channel portions CH1 and CH2.

The word line WL may have a surrounding shape that surrounds the channel portions CH1 and CH2 while being vertically oriented in the first direction D1. The word line WL having such a surrounding shape may be referred to as a gate all around (GAA) word line.

Figure 4A:
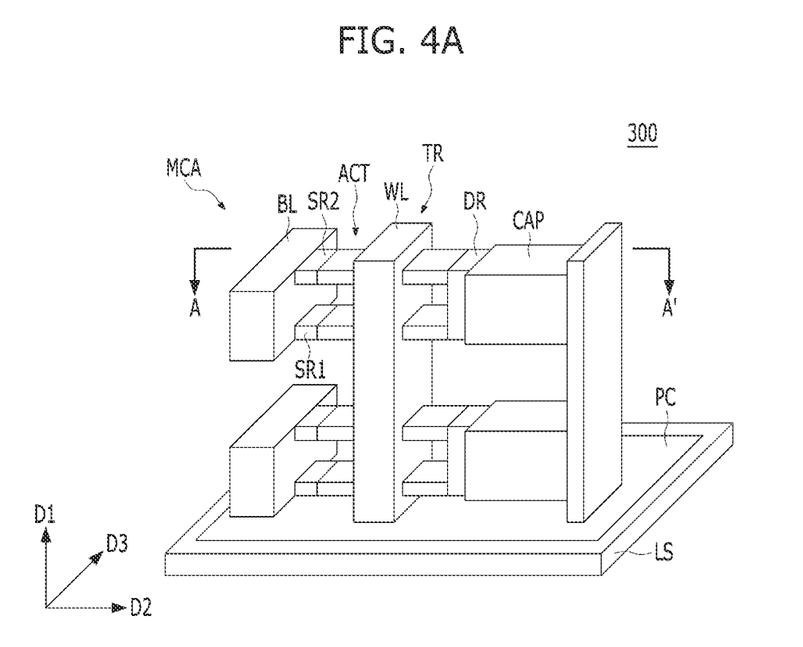
Figure 4B:
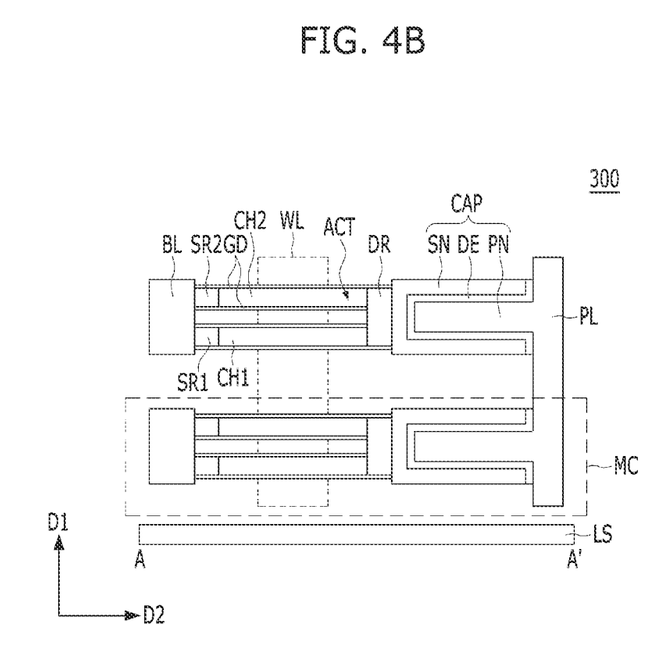

In the memory device 200, the memory cells MC may form a memory cell array MCA. The memory cell array MCA may include a stack of memory cells MC. The memory cells MC may be vertically stacked over the substrate structure LS in the first direction D1, and the memory cell array MCA may include memory cells MC that are arranged laterally in the second direction D2 and the third direction FIGS. 4A and 4B illustrate a schematic structure of a memory device 300 in accordance with another embodiment of the present invention. FIG. 4B is a cross-sectional view taken along a line A-A' of FIG. 4A. Referring to FIGS. 4A and 4B, the same reference numerals as those in FIGS. 1 to 3B may denote the same constituent elements. Hereinafter, detailed descriptions for the same constituent elements will be omitted.

Referring to FIGS. 4A and 4B, the memory device 300 may include a plurality of memory cells MC. The memory cells MC may be positioned over the substrate structure LS. Each of the memory cells MC may include a bit line BL, a transistor TR, and a capacitor CAP. The transistor TR may include a word line WL that is vertically oriented in the first direction D1. The bit line BL may be laterally oriented in the third direction D3. The transistor TR may be laterally oriented in the second direction D2. The capacitor CAP may be laterally oriented in the second direction D2 from the transistor TR. The substrate structure LS may include a peripheral circuit portion PC, and the peripheral circuit portion PC may include a plurality of control circuits for controlling the memory cells MC. The peripheral circuit portion PC may include a sense amplifier that is coupled to the bit line BL and a sub-word line driver that is coupled to the word line WL.

The transistor TR may include a gate all-around (GAA) transistor. The transistor TR may include an active layer ACT and a word line WL. The active layer ACT may be laterally oriented in the second direction D2 from the bit line BL. The word line WL may be vertically oriented in the first direction D1. The active layer ACT may include first doped portions SR1 and SR2, a second doped portion DR, and channel portions CH1 and CH2. The channel portions CH1 and CH2 may be positioned between the first doped portions SR1 and SR2 and the second doped portion DR. The first doped portions SR1 and SR2 may provide a first edge of the active layer ACT, and the second doped portion DR may provide a second edge of the active layer ACT.

The channel portions CH1 and CH2 may be laterally oriented in the second direction D2. The channel portions CH1 and CH2 may be laterally oriented in the second direction D2 between the first doped portions SR1 and SR2 and the second doped portion DR. The channel portions CH1 and CH2 may have a laterally flat plate shape. The channel portions CH1 and CH2 may have a greater length in the second direction D2 than a length in the third direction D3. The channel portions CH1 and CH2 may be referred to as nano sheets or nano sheet channels. Since the channel portions CH1 and CH2 are laterally oriented in the second direction D2, the channel portions CH1 and CH2 may be referred to as "lateral nano sheets". The channel portions CH1 and CH2 may include two channels, for example, a first channel portion CH1 and a second channel portion CH2. The first channel portion CH1 and the second channel portion CH2 may be vertically arranged in the first direction D1. A portion of the word line WL may fill the space between the first channel portion CH1 and the second channel portion CH2. The thickness of the first channel portion CH1 and the thickness of the second channel portion CH2 may be the same. Here, the thickness may be the thickness in the first direction D1. The channel portions CH1 and CH2 may include a semiconductor material, a monocrystalline semiconductor material, a polycrystalline semiconductor material, an oxide semiconductor, a metal compound, or a combination thereof. For example, the channel portions CH1 and CH2 may include monocrystalline silicon, polysilicon, silicon germanium, indium gallium zinc oxide (IGZO), $MoS_2$, and $WS_2$.

The first doped portions SR1 and SR2 may be coupled to the bit line BL. The first doped portions SR1 and SR2 may be coupled to the first edges of the channel portions CH1 and CH2, respectively. The first doped portions SR1 and SR2 may be vertically spaced apart in the first direction D1. The second doped portion DR may be coupled to the capacitor CAP. The second doped portion DR may be coupled to a storage node SN of the capacitor CAP. The second doped portion DR may be commonly coupled to the second edges of the channel portions CH1 and CH2. The second doped portion DR may be vertically oriented in the first direction D1. The first doped portion SR, the channel portions CH1 and CH2, and the second doped portion DR may be formed to be integrated. Accordingly, the active layer ACT may include a ring shape having an inner gap. The first doped portions SR1 and SR2 may have a separated source/drain structure that the first doped portions SR1 and SR2 are respectively coupled to the first edges of the two channel portions CH1 and CH2 and the second doped portion DR may have an integrated source/drain structure that is commonly coupled to the second edges of two channel portions CH1 and CH2.

The word line WL may have a surrounding shape that surrounds the channel portions CH1 and CH2 while being vertically oriented in the first direction D1. The word line WL having the surrounding shape may be referred to as a gate all around (GAA) word line.

In the memory device 300, the memory cells MC may form a memory cell array MCA. The memory cell array MCA may include a stack of memory cells MC. The memory cells MC may be vertically stacked over the substrate structure LS in the first direction D1, and the memory cell array MCA may include memory cells MC that are arranged laterally in the second direction D2 and the third direction D3.

Figure 5A:
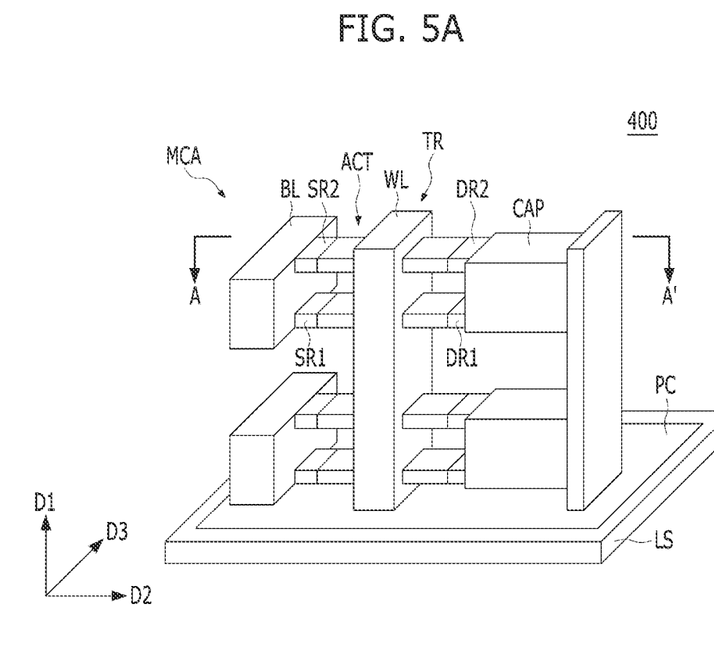
Figure 5B:
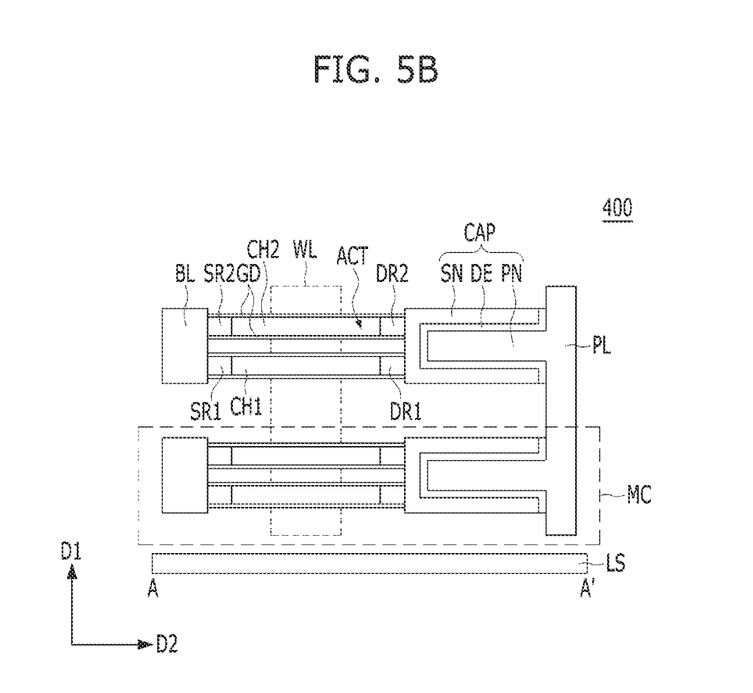

FIGS. 5A and 5B illustrate a schematic structure of a memory device 400 in accordance with another embodiment of the present invention, FIG. 5B is a cross-sectional view taken along a line A-A' shown in FIG. 5A. Referring to FIGS. 5A and 5B, the same reference numerals as those in FIGS. 1 to 4B may denote the same constituent elements. Hereinafter, detailed descriptions for the same constituent elements will be omitted.

Referring to FIGS. 5A and 5B, the memory device 400 may include a plurality of memory cells MC. The memory cells MC may be positioned over the substrate structure LS. Each of the memory cells MC may include a bit line BL, a transistor TR, and a capacitor CAP. The transistor TR may include a word line WL that is vertically oriented in the first direction D1. The bit line BL may be parallel to the substrate structure. The bit line BL may be laterally oriented in the third direction D3. The transistor TR may be laterally oriented in the second direction D2. The capacitor CAP may be laterally oriented in the second direction D2 from the transistor TR. The substrate structure LS may include a peripheral circuit portion PC, and the peripheral circuit portion PC may include a plurality of control circuits for controlling the memory cells MC. The peripheral circuit portion PC may include a sense amplifier that is coupled to the bit line BL and a sub-word line driver that is coupled to the word line WL.

The transistor TR may include a gate all-around (GAA) transistor. The transistor TR may include an active layer ACT and a word line WL. The active layer ACT may be laterally oriented in the second direction D2 from the bit line BL. The word line WL may be vertically oriented in the first direction D1. The active layer ACT may include first doped portions SR1 and SR2, second doped portions DR1 and DR2, and channel portions CH1 and CH2. The channel portions CH1 and CH2 may be positioned between the first doped portions SR1 and SR2 and the second doped portions DR1 and DR2. The first doped portions SR1 and SR2 may provide a first edge of the active layer ACT, and the second doped portions DR1 and DR2 may provide a second edge of the active layer ACT. The first doped portions SR1 and SR2 may have a separate source/drain structure that is coupled to the first edges of the two channel portions CH1 and CH2, respectively, and the second doped portions DR1 and DR2 may have a separate source/drain structure that is coupled to the second edges of the two channel portions CH1 and CH2, respectively.

The channel portions CH1 and CH2 may be laterally oriented in the second direction D2. The channel portions CH1 and CH2 may be laterally oriented in the second direction D2 between the first doped portions SR1 and SR2 and the second doped portions DR1 and DR2. The channel portions CH1 and CH2 may have a laterally flat plate shape. The channel portions CH1 and CH2 may have a greater length in the second direction D2 than a length in the third direction D1 The channel portions CH1 and CH2 may be referred to as nano sheets or nano sheet channels. Since the channel portions CH1 and CH2 are laterally oriented in the second direction D2, the channel portions CH1 and CH2 may be referred to as "lateral nano sheets". The channel portions CH1 and CH2 may include two channels, for example, a first channel portion CH1 and a second channel portion CH2. The first channel portion CH1 and the second channel portion CH2 may be vertically arranged in the first direction D1. A portion of the word line WL may fill the space between the first channel portion CH1 and the second channel portion CH2. The thickness of the first channel portion CH1 and the thickness of the second channel portion CH2 may be the same. Here, the thickness may be the thickness in the first direction D1. The channel portions CH1 and CH2 may include a semiconductor material, a monocrystalline semiconductor material, a polycrystalline semiconductor material, an oxide semiconductor, a metal compound, or a combination thereof. For example, the channel portions CH1 and CH2 may include monocrystalline silicon, polysilicon, silicon germanium, indium gallium zinc oxide (IGZO), $MoS_2$, and $WS_2$.

The first doped portions SR1 and SR2 may be coupled to the bit line BL. The first doped portions SR1 and SR2 may be coupled to the first edges of the channel portions CH1 and CH2, respectively. The first doped portions SR1 and SR2 may be vertically spaced apart in the first direction D1. The second doped portions DRA and DR2 may be commonly coupled to the capacitor CAP. The second doped portions DR1 and DR2 may be coupled to the storage node SN of the capacitor CAP. The second doped portions DR1 and DR2 may be coupled to the second edges of the channel portions CH1 and CH2, respectively. The second doped portions DR1 and DR2 may be vertically spaced apart in the first direction D1. The first doped portion SR1, the channel portion CH1, and the second doped portion DR1 may be integrated, and the first doped portion SR2, the channel portion CH2, and the second doped portion DR2 may be integrated. Accordingly, the active layer ACT may include a pair of nano sheets. For example, the first doped portion SR1 of the lower level, the first channel portion CH1, and the second doped portion DR1 of the lower level may form a lower-level nano sheet, and the first doped portion SR2 of the upper level, the second channel portion CH2, and the second doped portion DR2 of the upper level may form an upper-level nano sheet.

The word line WL may have a surrounding shape that surrounds the channel portions CH1 and CH2 while being vertically oriented in the first direction D1. The WL having the surrounding shape may be referred to as a gate all around (GAA) word line.

In the memory device 400, the memory cells MC may form a memory cell array MCA. The memory cell array MCA may include a stack of memory cells MC. The memory cells MC may be vertically stacked over the substrate structure LS in the first direction D1, and the memory cell array MCA may include memory cells MC that are arranged laterally in the second direction D2 and the third direction D3.

Figure 6:
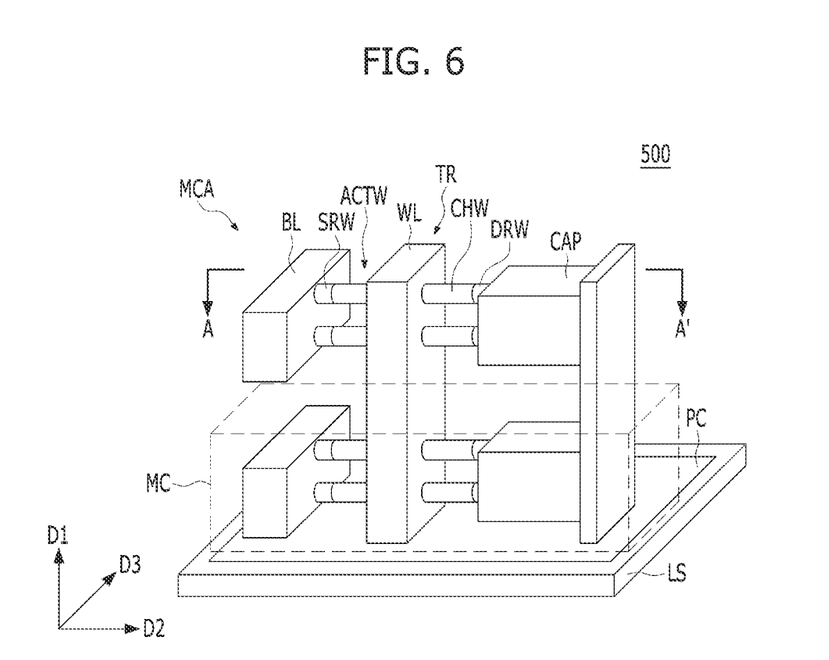

FIG. 6 is a diagram illustrating a schematic structure of a memory device 500 in accordance with another embodiment of the present invention. In FIG. 6, the same reference numerals as those in FIGS. 1 to 5B may denote the same constituent elements. Hereinafter, detailed descriptions for the same constituent elements will be omitted.

Referring to FIG. 6, the memory device 500 may include a plurality of memory cells MC. The memory cells MC may be positioned over the substrate structure LS. Each of the memory cells MC may include a bit line BL, a transistor TR, and a capacitor CAP. The transistor TR may include a word line WL that is vertically oriented in the first direction D1. The bit line BL may be laterally oriented in the third direction D3. The transistor TR may be laterally oriented in the second direction D2. The capacitor CAP may be laterally oriented in the second direction D2 from the transistor TR. The substrate structure LS may include a peripheral circuit portion PC, and the peripheral circuit portion PC may include a plurality of control circuits for controlling the memory cells MC. The peripheral circuit portion PC may include a sense amplifier that is coupled to the bit line BL and a sub-word line driver that is coupled to the word line WL.

The transistor TR may include a gate all-around (GAA) transistor. The transistor TR may include an active layer ACTW and a word line WL. The active layer ACTW may be laterally oriented in the second direction D2 from the bit line BL. The word line WL may be vertically oriented in the first direction D1. The active layer ACTW may include first doped portions SRW, second doped portions DRW, and channel portions CHW. The channel portions CHW may be positioned between the first doped portions SRW and the second doped portions DRW. The first doped portions SRW may provide a first edge of the active layer ACTW, and the second doped portions DRW may provide a second edge of the active layer ACTW.

The channel portions CHW may include at least two channels laterally oriented in the second direction D2. The channel portions CHW may be laterally oriented in the second direction D2 between the first doped portions SRW and the second doped portions DRW. The channel portions CHW may have a lateral wire shape. The channel portions CHW may be referred to as "nano wires" or "nano wire channels". Since the channel portions CHW are laterally oriented in the second direction D2, the channel portions CHW may be referred to as "lateral nanowires". The channel portions CHW may include at least two channel portions. The at least two channel portions CHW may be vertically arranged in the first direction D1. A portion of the word line WL may fill the space between the channel portions CHW. The channel portions CHW may include a semiconductor material, a monocrystalline semiconductor material, a polycrystalline semiconductor material, an oxide semiconductor, a metal compound, or a combination thereof. For example, the channel portions CHW may include monocrystalline silicon, polysilicon, silicon germanium, indium gallium zinc oxide (IGZO), $MoS_2$, or $WS_2$.

The first doped portions SRW may be coupled to the bit line BL. The first doped portions SRW may be coupled to the first edges of the channel portions CHW, respectively. The first doped portions SRW may be vertically spaced apart in the first direction D1. The second doped portions DRW may be commonly coupled to the capacitor CAP. The second doped portions DRW may be coupled to a storage node SN of the capacitor CAP. The second doped portions DRW may be respectively coupled to the second edges of the channel portions CHW. The second doped portions DRW may be vertically spaced apart in the first direction D1. The active layer ACTW may include a pair of nanowires. The first doped portions SRW may have a separated source/drain structure in which the first doped portions SRW are respectively coupled to the first edges of the two channel portions CH1 and CH2 and the second doped portions DRW may have a separated source/drain structure in which the second doped portions DRW are respectively coupled to the second edges of the two channel portions CH1 and CH2.

The word line WL may have a surrounding shape that surrounds the channel portions CHW and are vertically oriented in the first direction D1. The word line WL having the surrounding shape may be referred to as a gate all around (GAA) word line.

In the memory device 500, the memory cells MC may form a memory cell array MCA. The memory cell array MCA may include a stack of memory cells MC. The memory cells MC may be vertically stacked over the substrate structure LS in the first direction D1, and the memory cell array MCA may include memory cells MC that are laterally arranged in the second direction D2 and the third direction D3.

The memory devices 100 to 500 of the above-described embodiments may include the memory cells MC each of which includes two channels, a vertical word line WL, and a lateral bit line BL in order to improve the on-current and gate controllability of the transistor TR.

Doubling the width of one channel causes the decrease of the cell density. On the other hand, two channels make it possible to double the channel width without decreasing the cell density as well as to increase an area overlapping with the word line WL, which may improve gate controllability. By applying the vertical word line of the gate all-around (GAA) structure, the stack height of the memory cells MC may be lowered.

In an embodiment of the present invention, the peripheral circuit portion PC may be positioned at a higher level than the memory cell array MCA.

According to an embodiment of the present invention, a memory device may include transistors and capacitors that are stacked over a substrate in three dimensions. in this way, the integration of the memory device may be improved.

According to an embodiment of the present invention, since a is memory cell includes two channels, a vertical word line, and a lateral bit line, on-current and gate controllability of a transistor may be improved.

According to an embodiment of the present invention, since the transistor of a memory cell includes two nano sheet channels, the channel width may be doubled without decreasing the cell density and the overlapping area with the word line may be increased, so as to improve the gate controllability.

According to an embodiment of the present invention, a memory cell array may lower the stack height of the memory cells MC by applying vertical word lines of Gate All Around (GAA) structure.

While the present invention has been described with respect to specific embodiments, it will be apparent to those skilled in the art that various changes and modifications may be made without departing from the spirit and scope of the invention as defined in the following claims.

What is claimed is:

1. A memory device, comprising:
    a substrate;
    a bit line laterally oriented to be parallel to the substrate;
    a transistor including two channels that are laterally oriented from the bit line and a word line that is vertically oriented and surrounds the two channels; and
    a capacitor laterally oriented from the transistor
    wherein the two channels include two nano sheets that are laterally oriented from the bit line.

2. The memory device of claim 1, wherein the two channels include a monocrystalline semiconductor material, a polycrystalline semiconductor material, an oxide semiconductor, or a metal compound.

3. The memory device of claim 1, wherein the two channels include monocrystalline silicon, polysilicon, silicon germanium, indium gallium zinc oxide (IGZO), MoS2 or WS2.

4. The memory device of claim 1, further comprising:
    a first source/drain between first edges of the two channels and the bit line; and
    a second source/drain between second edges of the two channels and the capacitor.

5. The memory device of claim 4,
    wherein the first source/drain has an integrated source/drain structure so that the first source/drain is commonly coupled to the first edges of the two channels, and
    wherein the second source/drain has a separated source/drain structure so that the second source/drain is separated into two parts which are respectively coupled to the second edges of the two channels.

6. The memory device of claim 4,
    wherein the first source/drain has an integrated source/drain structure so that the first source/drain is commonly coupled to the first edges of the two channels, and
    wherein the second source/drain has an integrated source/drain structure so that the second source/drain is commonly coupled to the second edges of the two channels.

7. The memory device of claim 4,
    wherein the first source/drain has a separated source/drain structure so that the first source/drain is separated into two parts which are respectively coupled to the first edges of the two channels, and
    wherein the second source/drain has an integrated source/drain structure so that the second source/drain is commonly coupled to the second edges of the two channels.

8. The memory device of claim 4,
    wherein the first source/drain has a separated source/drain structure so that the first source/drain is separated into two parts which are respectively coupled to the first edges of the two channels, and
    wherein the second source/drain has a separated source/drain structure so that the second source/drain is separated into two parts which are respectively coupled to the second edges of the two channels.

9. The memory device of claim 1, further comprising a gate dielectric layer that surrounds the two channels.

10. The memory device of claim 1, wherein the capacitor includes:
    a cylindrical storage node that is coupled to the two channels and laterally oriented;
    a dielectric layer over the cylindrical storage node; and
    a plate node over the dielectric layer.

11. The memory device of claim 1, wherein the word line includes a metal-based material.

12. The memory device of claim 1, wherein the bit line includes a metal-based material.

13. A memory device, comprising:
    a substrate;
    a bit line laterally oriented to be parallel to the substrate;
    a transistor including two channels that are laterally oriented from the bit line and a word line that is vertically oriented and surrounds the two channels; and a capacitor laterally oriented from the transistor, wherein the two channels include two nano wires that are laterally oriented from the bit line.

14. A memory device, comprising:

a substrate including a peripheral circuit portion; and a memory cell array including a plurality of memory cells that are vertically stacked from the peripheral circuit portion, wherein each of the memory cells includes:

a bit line that is laterally oriented to be parallel to the substrate;

a transistor including two nano sheet channels that are laterally oriented from the bit line and a word line that is vertically oriented and surrounds the two nano sheet channels; and a capacitor that is laterally oriented from the transistor.

15. The memory device of claim 14, wherein the two nano sheet channels include a monocrystalline semiconductor material, a polycrystalline semiconductor material, an oxide semiconductor, or a metal compound.

16. The memory device of claim 14, wherein the two nano sheet channels include monocrystalline silicon, polysilicon, silicon germanium, IGZO, MoS2 or WS2.

17. The memory device of claim 14, further comprising:

a first source/drain between first edges of the two nano sheet channels and the bit line; and a second source/drain between second edges of the two nano sheet channels and the capacitor.

18. The memory device of claim 17, wherein the first source drain has an integrated source/drain structure so that the first source/drain is commonly coupled to the first edges of the two nano sheet channels, and wherein the second source/drain has a separated source/drain structure so that the second source/drain is separated into two parts which are respectively coupled to the second edges of the two nano sheet channels, respectively.

19. The memory device of claim 17, wherein the first source/drain has an integrated source/drain structure so that the first source/drain is commonly coupled to the first edges of the two nano sheet channels, and wherein the second source/drain has an integrated source/drain structure so that the second source/drain is commonly coupled to the second edges of the two nano sheet channels.

20. The memory device of claim 17, wherein the first source/drain has a separated source/drain structure so that the first source/drain is separated into two parts which are respectively coupled to the first edges of the two nano sheet channels, respectively, and wherein the second source/drain has an integrated source/drain structure so that the second/_source/drain is commonly coupled to the second edges of the two nano sheet channels.

21. The memory device of claim 17, wherein the first source/drain has a separated source/drain structure so that the first source/drain is separated into two parts which are respectively coupled to the first edges of the two nano sheet channels, and wherein the second source/drain has a separated source/drain structure so that the second source/drain is separated into two parts which are respectively coupled to the second edges of the two nano sheet channels.

22. The memory device of claim 14, further comprising a gate dielectric layer that surrounds the two nano sheet channels.

23. The memory device of claim 14, wherein the capacitor includes:

a cylindrical storage node that is coupled to the two nano sheet channels and laterally oriented;

a dielectric layer over the cylindrical storage node; and a plate node over the dielectric layer.

24. The memory device of claim 14, wherein the memory cell array is positioned at a higher level than the peripheral circuit portion or at a lower level than the peripheral circuit portion.

* * * * *